United States Patent [19]

Walton, II

[11] 4,152,827
[45] May 8, 1979

[54] TOOL FOR REMOVING INTEGRATED CIRCUIT PACKAGES

[75] Inventor: Charles E. Walton, II, Downingtown, Pa.

[73] Assignee: Burroughs Corporation, Detroit, Mich.

[21] Appl. No.: 901,586

[22] Filed: May 1, 1978

[51] Int. Cl.$^2$ .................. H05K 13/04; H05K 3/30
[52] U.S. Cl. .................................... 29/764; 29/278
[58] Field of Search ............... 29/764, 762, 278, 741, 29/626, 426, 427

[56] References Cited

U.S. PATENT DOCUMENTS

| | | | |
|---|---|---|---|
| 2,513,821 | 7/1950 | Schneider | 29/764 X |
| 3,538,580 | 11/1970 | Bruner | 29/764 X |
| 3,797,092 | 3/1974 | Einarson | 29/764 X |
| 3,974,556 | 8/1976 | Kubik | 29/764 |

Primary Examiner—Carl E. Hall
Attorney, Agent, or Firm—Mark T. Starr; Edmund M. Chung; Kevin R. Peterson

[57] ABSTRACT

The tool includes a limiting block, on one side of which is affixed a first gripping arm for grasping a first underside of the IC package. A second gripping arm is engagable with the second side of the limiting block for grasping the second underside of the IC package. Positioned above the limiting block, between the inner surfaces of the gripping arms, is an alignment head which supports the removal tool on the upper surface of the printed circuit board and positions the gripping arms in proper position to grasp the undersides of the IC package. Positioned above the alignment head and journaled between the gripping arms is a cylindrical cam having eccentric pivot points. To remove an IC package from a socket, the tool is positioned on the PC board with the legs of the alignment head straddling the ends of the IC socket. The second gripping arm is then engaged, causing the first and second gripping arms to grip opposite undersides of the IC package. After engaging the second gripping arm, the cam is rotated 180 degrees by means of an attached lever, the cam rotation perpendicularly raising both gripping arms away from the alignment head and thereby producing a uniform perpendicular force on each of the gripping arms to effect the removal of the IC package from the socket.

16 Claims, 5 Drawing Figures

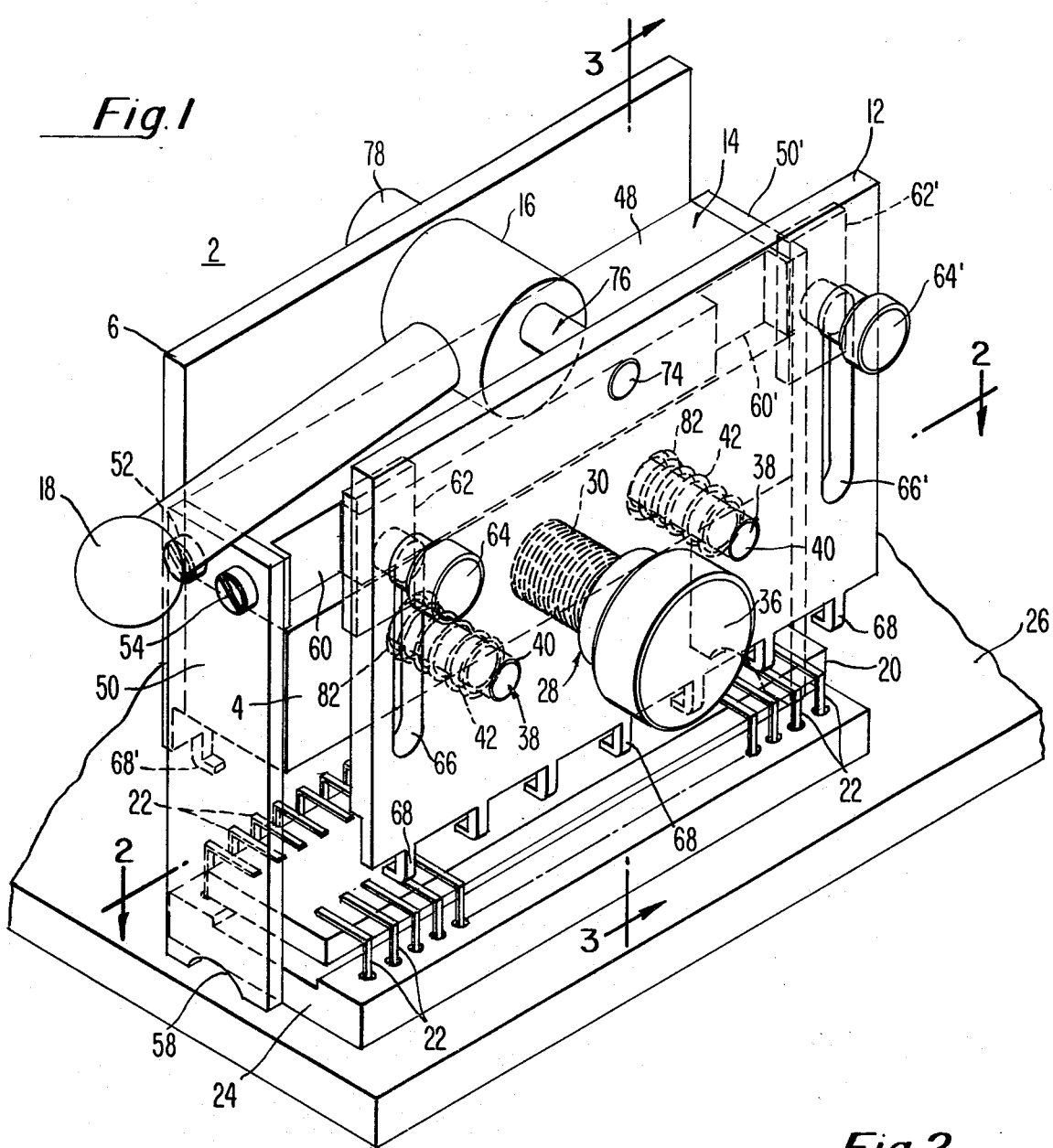

TOOL FOR REMOVING INTEGRATED CIRCUIT PACKAGES

BACKGROUND OF THE INVENTION

This invention relates in general to a tool for removing an integrated circuit (IC) package from a circuit board or connector. In particular, the tool finds use in removing leaded IC packages of the dual inline package (DIP) type characterized by two rows of external connecting pins which are inserted either directly into a printed circuit board or into a connector mounted on a printed circuit board.

A number of integrated circuit extraction tools, such as those disclosed in U.S. Pat. No. 3,602,971 issued to William M. Halstead on Sept. 7, 1971, U.S. Pat. No. 3,757,406 issued to William Bezar on Sept. 11, 1973 and U.S. Pat. No. 3,797,092 issued to Norman S. Einarson on Mar. 19, 1974, have a generally plier-like appearance with the clamping ends having a number of slots for engaging the pins along the sidewalls of the integrated circuit package. Other extractors, such as those disclosed in U.S. Pat. No. 3,443,297 issued to Thomas K. Lusby, Jr. on May 13, 1969, U.S. Pat. No. 3,632,973 issued to James Edward O'Keefe on Jan. 4, 1972, U.S. Pat. No. 3,699,629 issued to Jesse C. Hood et al on Oct. 24, 1972 and U.S. Pat. No. 3,896,533 issued to Robert Ullman et al on July 29, 1975, have clamping ends which grasp the circuit package at its sides or ends. Either of these general types of extractors tend to be somewhat large and cumbersome so that gaining access to an individual circuit package on a densely populated circuit board is difficult.

Another type of extractor, such as that disclosed in U.S. Pat. No. 3,640,519 issued to William M. Halstead on Feb. 8, 1972, has an alligator-type clip configuration for engaging a plurality of the pins along the sidewalls of the package. While this type of extractor is somewhat smaller in size than the above-described types, sufficient space must be available along the sidewalls between packages to permit the opening of the clip jaws to engage the pins of the integrated circuit package.

Another type of extractor, such as that disclosed in U.S. Pat. No. 3,538,580 issued to Peter Martin Bruner on Nov. 10, 1970, has a relatively rigid frame which fits around an integrated circuit package to center working arms carrying teeth closed to grip the integrated circuit between the leads thereof.

In all of the extractors referred to above, the direction of the extraction force is wholly dependent upon the user. That is, if the user is unsteady, it is quite possible that the extraction force will be applied at an acute angle rather than perpendicularly. Should this occur, misalignment or possibly even irrepairable damage to the integrated circuit pins may result.

The extraction tool disclosed in U.S. Pat. No. 3,974,556 issued to Peter Steve Kubik on Aug. 17, 1976, provides an improvement over the previously discussed prior art. The tool has provision for converting a user applied compressive force into two components. One component actuates apparatus for grasping the underside of the integrated circuit package while the other component produces a nearly uniform perpendicular force on apparatus which straddles the integrated circuit package to effect the extraction. The extractor tool disclosed by Kubik has several limitations. It does not self center itself so as to insure that its hooks grasp the underside of the integrated circuit package about the center pin in each of the two rows of pins. Hence, if the user engages the tool about off-center pins, the tool will not apply an extraction force uniformly to the underside of the circuit package. This can result in the bending of pins as the circuit package would not be extracted with its horizontal plane parallel to the circuit board's horizontal plane. The inability to self-center can also result in the user engaging the hooks against rather than about the pins of the circuit package. This would most likely occur when extracting circuit packages whose pins are in contact with the circuit package sidewalls rather than being spaced away from the sidewalls, since with this type of circuit package the tool's legs cannot be aligned by passing them through the gaps between the pins.

The Kubik extraction tool only engages one pin on each sidewall of the circuit package and hence it appears incapable of extracting circuit packages having a large number of pins, such circuit packages requiring a relatively high extraction force.

Although the Kubik tool represents an advance over the prior art in being capable of applying a nearly perpendicular extraction force, it is still dependent on the user maintaining the tool's four legs on the circuit board surface as he applies compressive force to the tool. Failure of the operator to fulfill this requirement can result in misalignment of the circuit package's pins.

It is a general object of the present invention to provide a tool for removing integrated circuit packages from a circuit board or connector.

It is a further object of the present invention to provide an IC removal tool which applies a perpendicular extraction force without depending on the user maintaining proper tool positioning.

It is another object of the present invention to provide an IC removal tool which is self centering with respect to engaging itself about IC pins.

It is still another object of the present invention to provide an IC removal tool which applies a uniform extraction force at all points on the underside of the IC circuit package.

It is yet another object of the present invention to provide an IC removal tool capable of removing ICs having a relatively large number of pins.

Still further, it is an object of the present invention to provide an IC removal tool which limits the amount of compressive force applied to the pin populated sidewalls of an IC package so as to avoid damage to the pins during removal of the IC package.

These and other objects, features and advantages of the present invention will become more apparent from the detailed description of the preferred embodiment when read in conjunction with the drawings.

SUMMARY OF THE INVENTION

In accordance with the present invention, there is provided a tool for removal of an IC package from a connector or circuit board, the IC package having a first and second plurality of equally spaced-apart pins affixed along a first pair of parallel sidewalls, the IC package further having a second pair of parallel sidewalls which extend between the first pair of sidewalls.

The tool assembly includes a rectangular shaped limiting block and a gripping arm affixed to one side of the limiting block for grasping an underside of the IC package about at least one pin of the first plurality of pins. A second gripping arm is engagable with the opposite side of the limiting block for grasping an underside of the IC package about at least one pin of the second plurality of pins. The first and second gripping arms include a plurality of aligned teeth spaced so they fit between the pins of the IC package. Positioned above and parallel to the upper surface of the limiting block, between the inner surfaces of the gripping arms, is a channel-iron shaped alignment head, the legs of which extend perpendicularly down the ends of the limiting block. The alignment head straddles the second pair of the IC package's sidewalls to position the gripping arms in proper position to grasp the underside of the IC package and to provide support for the removal tool on the upper surface of the printed circuit board. Positioned above the alignment head and journaled between the gripping arms is a cylindrical cam having eccentric pivot points. A cam lever attached to the cam surface enables the user to rotate the cam approximately 180 degrees.

For use in removing an IC package from a socket, the tool is positioned above the IC socket with the legs of the alignment head straddling the ends of the IC socket. The second gripping arm is then engaged, causing the first and second gripping arms to grip opposite undersides of the IC package about the pins affixed along the first pair of parallel sidewalls. After engaging the second gripping arm, the cam lever is rotated 180 degrees, the resulting cam rotation functioning to perpendicularly raise both gripping arms away from the alignment head and thereby producing a uniform perpendicular force on each of the gripping arms to effect the removal of the IC package from the socket.

BRIEF DESCRIPTION OF THE DRAWINGS

FIG. 1 is a pictorial view of the removal tool of the present invention positioned on a typical integrated circuit package installed in a connector which is attached to a printed circuit board.

FIG. 2 is a partial section view taken along the lines 2—2 of FIG. 1 and depicts the second gripping arm in the retracted position.

DESCRIPTION OF THE PREFERRED EMBODIMENT

Figure 3:
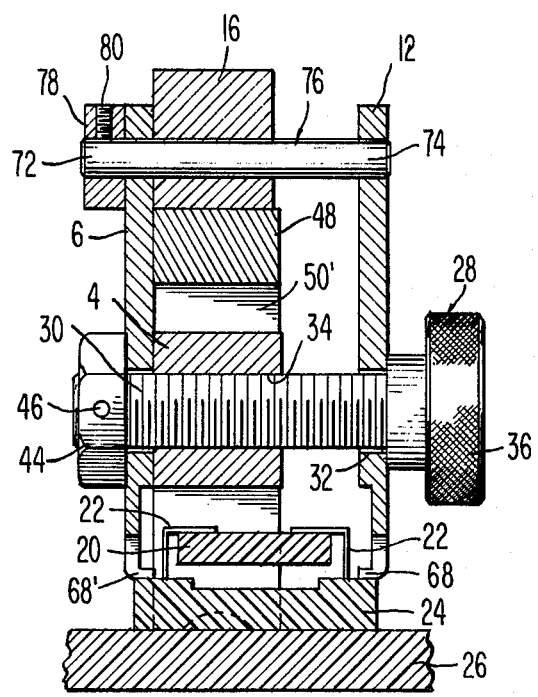
FIG. 3 is a section view taken along the lines 3—3 of FIG. 1 and depicts the positioning of the removal tool on the integrated circuit package prior to activating the arm closing means.

A pictorial view of the removal tool 2 of the present invention appears in FIG. 1. The tool 2 includes a rectangular shaped limiting block 4 and a first gripping arm 6. The first gripping arm 6 is affixed to one of the opposed sides of limiting block 4, for example, by screws 8 and 10 (FIG. 2). Referring again to FIG. 1, a second gripping arm 12 is retractably mounted with its inner surface opposing the second opposed side of limiting block 4. A channel-iron shaped alignment head 14 fits over the top and both ends of limiting block 4. Journaled between the inner surfaces of gripping arms 6,12 and above the alignment head 14, is a cylindrical cam 16, the cam 16 being rotatable about its pivot points by means of attached cam lever 18.

Before proceeding with a more detailed description of the construction of the removal tool 2, it may be helpful to describe the construction of the type of integrated circuits the preferred embodiment of the present invention is designed to remove. Referring again to FIG. 1, a pictorial view of a dual inline package (DIP) type integrated circuit (IC) 20 is shown. The IC 20 is characterized by two rows of external connecting pins 22 which are received by corresponding holes in connector 24 when the IC 20 is inserted in the connector 24. The number of pins 22 will vary with the type of integrated circuit 20. The preferred embodiment of the present invention is designed to remove ICs 20 having forty pins 22, although it can easily be adapted to remove ICs 20 having more or less pins 22. In the preferred embodiment, the removal tool 2 is designed to extract ICs 20 which are connected to a printed circuit (PC) board 26 via a connector 24 mounted on the PC board 26. However, as will be obvious to those skilled in the art, variations in the removal tool 2 design may be made to permit it to remove ICs 20 mounted directly on the PC board 26.

Figure 4:
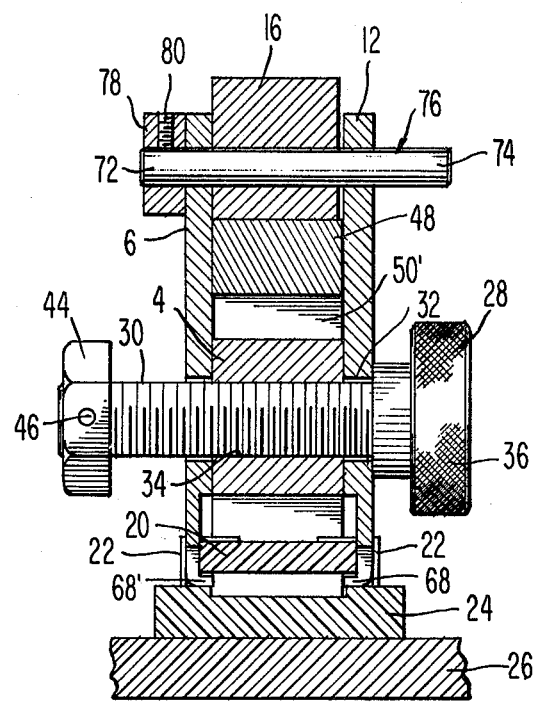
FIG. 4 is a view similar to FIG. 3 and depicts the positioning of the removal tool on the integrated circuit package after engaging the arm closing means.

FIG. 2 is a partial section view taken along the lines 2—2 of FIG. 1 and illustrates the retractable mounting of the second gripping arm 12 on the limiting block 4. The second gripping arm 12 is movable from a retracted position as shown in FIG. 2, through an intermediate position, to an engaged position (FIG. 4) by means of arm closing means 28. Referring again to FIG. 2, the arm closing means 28 includes a threaded shaft 30 which passes through a non-threaded hole 32 in the second gripping arm 12 and screws into a threaded hole 34 in limiting block 4. A handle 36 is connected to the end of the threaded shaft 30 passing perpendicularly through the second gripping arm 12. As the user turns handle 36 in the direction to engage the threaded shaft 30 in limiting block 4, the base of handle 36 pushes the second gripping arm 12 towards the limiting block 4 to position the second gripping arm in the engaged position. In order to move the second gripping arm 12 to the retracted position, the direction of rotation of handle 36 is reversed. Spring loaded spindles 38 bias the second gripping arm 12 away from the limiting block 4. The spring loaded spindles 38 include a pair of shafts 40 press fitted in the limiting block 4 and slidable through corresponding holes in the second gripping arm 12. A pair of helical springs 42 positioned about shafts 38 serve to push the second gripping arm 12 from the engaged position through an intermediate position to the retracted position shown in FIG. 2. A limiting collar 44 is held in position on the limiting block 4 end of threaded shaft 30 by a pin 46 passing through a hole in the limiting collar 44 and a corresponding hole in threaded shaft 30. The limiting collar 44 serves to limit the maximum distance between the opposing surfaces of the second gripping arm 12 and the limiting block 4 and prevents the threaded shaft 30 from being screwed out of the limiting block 4.

Figure 5:
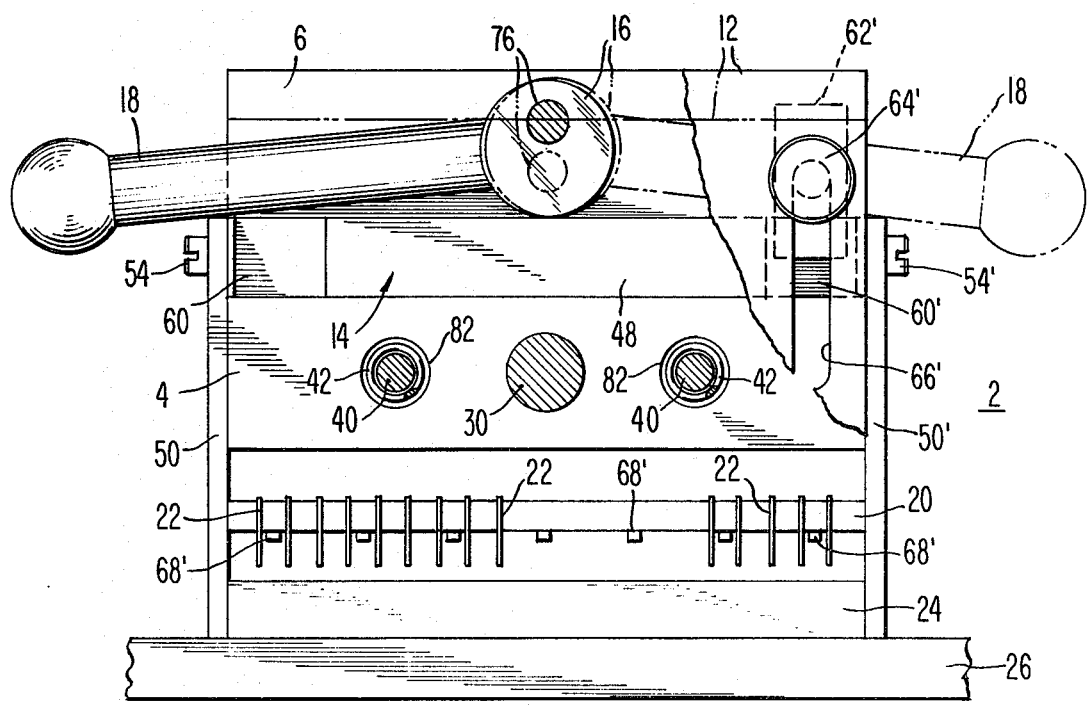
FIG. 5 is a front view of the present invention with portions cut away and depicts the final stage of removal wherein the IC package has been fully grasped by the tool and lifted from the connector.

Referring to FIG. 5, the alignment head 14 includes a cross-member 48 and two legs 50,50'. One end of each leg 50,50' is affixed to the cross-member 48, for example by screws 52,54 (FIG. 1) which affixes legs 50 to cross-member 48. An equivalent pair of screws 52', 54' (not shown) affixes leg 50' to cross-member 48. The length of the cross-member 48 is chosen to be equal to the length of limiting block 4 so that the opposing inner surfaces of attached legs 50,50' are in slidable contact with the ends of limiting block 4. The free ends of legs 50,50' straddle the connector 24 and sit on the surface of printed circuit board 26, as is best seen in FIG. 5. Referring again to FIG. 1, it will be noted that a notch 58 exists in the free end of leg 50. A similar notch 58' (not shown) exists in the free end of leg 50'. The notches 58,58' serve to increase the stability of the legs 50,50' when they sit on the surface of printed circuit board 26.

Cross-member 48 may include a pair of cutout sections 60,60' in its side opposing the second gripping arm 12. These cutout sections 60,60' cooperate with spacers 62,62' (FIG. 1) to control the distance between the opposing surfaces of limiting block 4 and the second gripping arm 12 when the second gripping arm 12 is in the engaged position. Thus, spacers 62,62' may be raised to the position shown in FIG. 1 by means of threaded set screws 64 and 64' which pass through channels 66 and 66' of second gripping arm 12 and screw into corresponding threaded holes in spacers 62 and 62', respectively. With the spacers 62, 62' raised to the position shown in FIG. 1, when the second gripping arm 12 is moved to the engaged position, the spacers mesh with the cutout sections 60,60' in limiting block 4 such that the inner surface of the second gripping arm 12 is in contact with the opposed surface of limiting block 4. Contrary to this, if the spacers 62,62' are moved to their lowered position, the spacers 62, 62' will block the opposing surfaces of limiting block 4 and the second gripping arm 12 from contacting each other when the second gripping arm 12 is in the engaged position, the distance between the latter mentioned surfaces being equal to the thickness of the spacers 62,62'. The spacers 62,62' enable the user to control the distance between the opposed gripping arms 6, 12 when the second gripping arm 12 is engaged and thus allows the tool 2 to accommodate two sizes of IC packages, 20 one having a greater distance between the two rows of pins 22 that the other.

As can be seen in FIG. 1, the lower edge of second gripping arm 12 has a plurality of aligned teeth 68 spaced so they fit between the pins 22 of the IC package 20. The free ends of the aligned teeth 68 have generally right-angle bends therein, the bends being directed towards the opposing surface of the first gripping arm 6. An opposing plurality of aligned teeth 68' are included in the bottom edge of the first gripping arm 6.

A cylindrical cam 16 is journaled between the opposed surfaces of the gripping arms 6,12. As can best be seen in FIG. 4, a pivot pin 76, press fitted into the cam 16, passes perpendicularly through the cam's 16 two bases at a point eccentric with the axis of the cam 16. Collar 78, which is held in place on one end 72 of pivot pin 76 by locking screw 80, maintains the inner surface of the first gripping arm 6 in slidable contact with the opposing base of cam 16. As the second gripping arm 12 is moved from the engaged to the retracted position, or visa versa, the second gripping arm 12 slides along end section 74 of pivot pin 76, the pivot pin 76 passing perpendicularly through the surface of second gripping arm 12. To accommodate the movement section 74 of pivot pin 76 is at least equal to the distance between the cam 16 base adjacent to end section 74 and the non-opposed surface of the second gripping arm 12 when the second gripping arm 12 is in the retracted position (FIG. 3).

Referring now to FIG. 5, a cam lever 18 is attached to the cam perpendicular with its cylindrical surface. The user may rotate the cam lever 18 approximately 180 degrees causing a proportional rotation of the cam 16. Refer now to the position of the cam lever 18 as shown in FIG. 5 in phantom. As the cam lever 18 is rotated counter-clockwise, the cam 16, due to its eccentric pivot points, engages the upper surface of cross-member 48 and exerts a downward force on it. Since the legs 50,50' of alignment head 14 are seated on the surface of printed circuit board 26, as the cam 16 pushes down on cross-member 48, an upward force is exerted on pivot pin 76, which results in gripping arms 6,12 and the limiting block 4 they are clamped to moving perpendicularly upward. FIG. 1 best illustrates the positioning of the gripping arms 6,12 and limiting block 4 with respect to the alignment head 14 after the cam 16 is rotated counter-clockwise.

A detailed description of how the removal tool 2 is used will now be given.

Referring to FIG. 1, it will be assumed that the IC 20 pin spacing is similar to that shown and that the IC 20 is mounted in a socket 24 which is attached to PC board 26. For such an IC 20, the spacers 62,62' are not required and hence spacers 62,62' are locked in the raised position shown by means of locking bolts 64,64', respectively. With the cam lever 18 in the position shown, the user positions the tool 2 on the PC board 26 with legs 50,50' straddling the ends of socket 24. The legs 50,50' serve to position the tool 2 in proper orientation such that teeth 68,68' are aligned between corresponding pairs of pins 22 of IC 20.

Cam lever 18 is now rotated clockwise 180 degrees to the position shown in phantom in FIG. 5. The rotation of the cam lever 18 rotates the cam 16 to a position where it is not asserting a downward force on cross-member 48 and hence first and second gripping arms 6,12 are lowered to the position shown in FIG. 3. Note that limiting block 4, which is connected to the first and second gripping arms 6,12 and slidable between legs 50,50', is also lowered as the gripping arms 6,12 are lowered.

At this point the second gripping arm 12 is in the retracted position as shown in FIG. 3. The user now engages the arm closing means 28 by turning handle 36 clockwise (FIG. 1). Referring again to FIG. 3, as the handle 36 is turned clockwise, engaging rod 30 is screwed into the threaded hole it passes through in first gripping arm 6. As the engaging rod 30 is screwed into the first gripping arm 6, the attached handle 36 pushes the second gripping arm 12 closer to the limiting block 4. As the second gripping arm 12 moves from the retracted to the engaged position, its inner surface remains parallel with the opposing surface of limiting block 4 due to the force springs 42 exert against the second gripping arm 12 and the guidance provided by shafts 40 on which the second gripping arm 12 slides. As the second gripping arm 12 moves toward the limiting block 4, springs 42 are compressed and pushed into holes 82 in limiting block 4 so as not to interfere with the inner surface of the second gripping arm 12 moving against the opposing surface of limiting block 4. The handle 36 is tightened until the inner surface of the second gripping arm 12 is in contact with the opposing surface of limiting block 4. In this engaged position (FIG. 4), teeth 68', 68 of first and second gripping arms 6,12 are engaged between the pins 22 with the right angle bends of the teeth 68,68' positioned to grasp the underside of the IC package 20. Note that the limiting block 4 serves to limit the minimum distance between the first and second gripping arms 6,12 and hence prevent the arms 6,12 from crushing the IC 20 sidewalls.

As can be seen in FIG. 5, the cam 16 is in contact with the upper surface of cross-member 48 with the cam lever 18 in the position shown in phantom. As the user next rotates the cam lever 18 counter-clockwise to the position shown in FIG. 5 in solid lines, the cam 16 rotates abouts its eccentrically oriented pivot points. As the cam 16 rotates, its cylindrical surface exerts a downward force on the upper surface of cross-member 48 and an opposed upward force on gripping arms 6,12 which are connected to the cam 16 bases by pivot pin 76. The gripping arms 6,12 are raised perpendicularly with respect to the PC board 26, since the angle at which the gripping arms 6,12 are raised is controlled by limiting block 4, to which both gripping arms 6,12 are clamped. Limiting block 4 is slidably positioned between the legs 50,50' of alignment head 14, and since the legs 50,50' sit on the PC board 26 in a direction perpendicular with the PC board 26 surface, the limiting block 4 is raised perpendicularly with respect to the PC board 26 surface.

As the gripping arms 6,12 are raised perpendicularly with respect to the PC board's 26 surface, teeth 68, 68' of gripping arms 12,6 apply a uniform perpendicular force, in a direction away from the surface of the PC board 26, to the underside of IC 20. This force is effective to pull the IC 20 out of its socket 24, as can be seen in FIG. 5.

After the IC 20 has been removed from the socket 24, it is still held along its sidewalls by the engaged first and second gripping arms 6,12. In order to release the IC 20 from the gripping arms 6,12, the user rotates handle 36 (FIG. 2) in the direction to remove threaded engaging rod 30 from limiting block 4. As the engaging rod 30 is removed, springs 42 bias the second gripping arm 12 in a direction away from the girst gripping arm 6. As the second gripping arm reaches the retracted position, as shown in FIG. 2, the IC 20 is released from the teeth 68,68' of the gripping arms 12,6.

Having shown, and described a preferred embodiment of the invention, those skilled in the art will realize that various omissions, substitutions and changes in forms and details of the tool 2 may be made without departing from the spirit of the invention. For example, the tool 2, in its present form or with obvious modifications, can accommodate IC packages 20 with different pin 22 configurations than that of the preferred embodiment and can remove ICs 20 mounted directly in the PC board 26. It is the intention, therefore, to be limited only as indicated by the scope of the following claims.

I claim:

1. A tool for removing an integrated circuit package of the type having a first and second plurality of equally spaced-apart pins affixed along a first pair of parallel sidewalls, said circuit package further having a second pair of parallel sidewalls which extend between said first pair of parallel sidewalls, said tool comprising:
    a limiting block having first and second pairs of opposed sides;
    first gripping means, connected to the first of said first pair of opposed sides, said first gripping means for grasping an underside of said circuit package about at least one pin of said first plurality of pins;
    second gripping means, engagable with the second of said first pair of opposed sides, for grasping an underside of said circuit package about at least one pin of said second plurality of pins;
    arm closing means for moving said second gripping means between a retracted position and an engaged position, whereby said second gripping means is engaged against the second of said first pair of opposed sides when said second gripping means is in the engaged position and said second gripping means is remote from the second of said first pair of opposed sides when said second gripping means is in the retracted position;
    alignment head means, positioned above said limiting block, whereby said limiting block is nested and floating within said alignment head means, said alignment head means for aligning said first and second gripping means in position to grasp the underside of said circuit package; and
    camming means, journaled between the opposing inner surfaces of said first and second gripping means above said alignment head means, for simultaneously raising said first and second gripping means with respect to said alignment head means.

2. The integrated circuit removal tool in accordance with claim 1 wherein said camming means comprises:
    a cylindrical cam;
    a pivot pin, connected to said cylindrical cam and passing perpendicularly through the first and second bases of said cylindrical cam, the first and second end sections of said pivot pin extending from the first and second bases of said cylindrical cam and journaled in said first and second gripping means, respectively; and
    a cam lever, connected perpendicularly to the surface of said cylindrical cam, for rotating said cylindrical cam about its pivot points.

3. The integrated circuit removal tool in accordance with claim 2 further characterized in that said pivot pin passes through said cylindrical cam at a point eccentric with the axis of said cylindrical cam.

4. The integrated circuit removal tool in accordance with claim 3 further characterized in that the location of mounting of said cam lever on the surface of said cam causes said cam to apply a force to the upper surface of said alignment feed means when said cam lever is rotated from a first position to a second position.

5. The integrated circuit removal tool in accordance with claim 2 wherein:
    said camming means further includes means for retaining the cam's base closest to the inner surface of said first gripping means in close proximity to the inner surface of said first gripping means;
    the length of the second end section of said pivot pin is at least equal to the distance between said cam's second base and the outer surface of said second gripping means when said second gripping means is in the retracted position; and
    the second gripping means is slidable along the second end section's shaft.

6. The integrated circuit removal tool in accordance with claim 1 further characterized in that the first and second gripping means each have a plurality of aligned teeth, the teeth spaced so they fit between the pins of the circuit package.

7. The integrated circuit removal tool in accordance with claim 6 further characterized in that the free ends of said aligned teeth have generally right-angle bends therein, said bends on said first gripping means being directed towards said bends on said second gripping means.

8. The integrated circuit removal tool in accordance with claim 1 wherein said arm closing means comprises:
    a threaded engaging rod, said engaging rod passing perpendicularly through a hole in the horizontal plane of said second gripping means, said engaging rod mating with a threaded hole in said limiting block, for moving said second gripping means toward said limiting block; and a plurality of spring loaded spindles mounted perpendicularly on the second of said first pair of opposed sides and passing through a plurality of corresponding holes in said second gripping means, for moving said second gripping means to its retracted position.

9. The integrated circuit removal tool in accordance with claim 1 wherein said means closing means further includes means for limiting the maximum distance between said limiting block and said second gripping arm when said arm closing means is in the retracted position.

10. The integrated circuit removal tool in accordance with claim 1 further including spacer means slidably mounted on said second gripping means, for increasing the distance between said first and second gripping arms when said means closing means is in the engaged position.

11. The integrated circuit removal tool in accordance with claim 1 wherein said first pair of opposed sides are spaced apart by a distance which is substantially equal to the distance between said first pair of parallel sidewalls.

12. The integrated circuit removal tool in accordance with claim 11 wherein said second pair of opposed sides are spaced apart by a distance which is equal to or less than the distance between said second pair of parallel sidewalls.

13. The integrated circuit removal tool in accordance with claim 1 wherein said alignment head means includes:

a pair of legs; and a cross-member connecting one end of each of said legs.

14. The integrated circuit removal tool in accordance with claim 13 wherein the length of said cross-member is chosen such that the distance between said pair of legs is at least equal to the distance between said second pair of parallel sidewalls.

15. The integrated circuit removal tool in accordance with claim 14 wherein said alignment head means is positioned with the legs extending parallel to the vertical axis of the second pair of parallel sidewalls.

16. The integrated circuit removal tool in accordance with claim 13 wherein said camming means is positioned above the cross-member of said alignment head means.

* * * * *

UNITED STATES PATENT AND TRADEMARK OFFICE
CERTIFICATE OF CORRECTION

PATENT NO.   : 4,152,827
DATED        : May 8, 1979
INVENTOR(S)  : Charles E. Walton, II It is certified that error appears in the above-identified patent and that said Letters Patent are hereby corrected as shown below:

In Claim 4, line 38, change "feed" to --head--.
In Claim 9, line 11, change "said means" to --said arm--.
In Claim 9, line 13, change "arm" to --means--.
In Claim 10, line 18, change "arms" to --means--.
In Claim 10, line 19, change "means" to --arm--.

Signed and Sealed this

Thirty-first Day of July 1979

[SEAL]

Attest:

Attesting Officer

LUTRELLE F. PARKER
*Acting Commissioner of Patents and Trademarks*